(12) United States Patent
Cao et al.

(10) Patent No.: US 11,495,718 B2
(45) Date of Patent: Nov. 8, 2022

(54) DRIVING SUBSTRATE, METHOD FOR PREPARING THE SAME, AND DISPLAY DEVICE

(71) Applicant: BOE TECHNOLOGY GROUP CO., LTD., Beijing (CN)

(72) Inventors: Zhanfeng Cao, Beijing (CN); Yingwei Liu, Beijing (CN); Ke Wang, Beijing (CN); Dongni Liu, Beijing (CN); Minghua Xuan, Beijing (CN); Guangcai Yuan, Beijing (CN); Lei Chen, Beijing (CN); Xue Dong, Beijing (CN)

(73) Assignee: Beijing Boe Technology Development Co., Ltd., Beijing (CN)

( * ) Notice: Subject to any disclaimer, the term of this patent is extended or adjusted under 35 U.S.C. 154(b) by 8 days.

(21) Appl. No.: 17/265,806

(22) PCT Filed: May 13, 2020

(86) PCT No.: PCT/CN2020/090001
§ 371 (c)(1),
(2) Date: Feb. 3, 2021

(87) PCT Pub. No.: WO2021/226868
PCT Pub. Date: Nov. 18, 2021

(65) Prior Publication Data
US 2021/0359184 A1 Nov. 18, 2021

(51) Int. Cl.
*H01L 33/62* (2010.01)
*G09G 3/00* (2006.01)
*G09G 3/32* (2016.01)

(52) U.S. Cl.
CPC ............. *H01L 33/62* (2013.01); *G09G 3/035* (2020.08); *G09G 3/32* (2013.01);
(Continued)

(58) Field of Classification Search
None
See application file for complete search history.

(56) References Cited

U.S. PATENT DOCUMENTS 7,348,198 B2 * 3/2008 Ahn .................. G02F 1/134363
257/E21.258
7,671,367 B2 * 3/2010 Ahn .................. G02F 1/134363
257/E21.32
(Continued)

FOREIGN PATENT DOCUMENTS

CN 108267903 A * 7/2018 ....... G02F 1/133345
CN 109859647 A 6/2019
(Continued)

*Primary Examiner* — Vinh T Lam
(74) *Attorney, Agent, or Firm* — Muncy, Geissler, Olds & Lowe, P.C.

(57) ABSTRACT

The present disclosure provides a driving substrate, a method for preparing the same, and a flexible display device. The driving substrate includes: a base substrate; a first driving function layer arranged on a first surface of the base substrate, the first driving function layer including a plurality of driving thin film transistors and a plurality of signal wirings, and at least one of the plurality of signal wirings being of a single-layer structure and having a thickness greater than a threshold; a pad layer arranged on a surface of the first driving function layer away from the base substrate, the pad layer including a plurality of first pads and a plurality of second pads, and each first pad being connected to a first electrode of the corresponding driving thin film transistor and each second pad being connected to a common electrode line in the plurality of signal wirings.

16 Claims, 10 Drawing Sheets

(52) U.S. Cl.
 CPC . *G09G 2300/0426* (2013.01); *G09G 2380/02* (2013.01); *H01L 2933/0066* (2013.01)

(56) References Cited

U.S. PATENT DOCUMENTS

| | | | |
|---|---|---|---|
| 9,985,192 B2 * | 5/2018 | Peng | H01L 27/1248 |
| 10,374,028 B1 * | 8/2019 | Lim | H04N 9/3179 |
| 10,516,081 B1 * | 12/2019 | Xin | H01L 33/24 |
| 10,923,558 B2 * | 2/2021 | Managaki | H01L 27/3276 |
| 11,069,763 B2 * | 7/2021 | Lim | H01L 27/3262 |
| 11,217,156 B2 * | 1/2022 | He | G09G 3/3225 |
| 11,289,635 B2 * | 3/2022 | Son | H01L 25/167 |
| 2016/0283000 A1 * | 9/2016 | Wang | G06F 3/0443 |
| 2017/0025399 A1 | 1/2017 | Takeya et al. | |
| 2019/0114958 A1 | 4/2019 | Shin et al. | |
| 2019/0333455 A1 * | 10/2019 | El-Ghoroury | H01L 25/167 |
| 2020/0052033 A1 | 2/2020 | Iguchi | |
| 2020/0312237 A1 | 10/2020 | He et al. | |
| 2020/0312831 A1 * | 10/2020 | He | H01L 25/18 |
| 2021/0066538 A1 * | 3/2021 | Liu | H01L 27/156 |
| 2021/0233899 A1 | 7/2021 | Lu | |
| 2021/0359182 A1 * | 11/2021 | Cao | H01L 25/0753 |

FOREIGN PATENT DOCUMENTS

| | | | | |
|---|---|---|---|---|
| CN | 109979981 A | | 7/2019 | |
| CN | 109994528 A | * | 7/2019 | G09G 3/3406 |
| CN | 110649042 A | | 1/2020 | |
| CN | 110867158 A | | 3/2020 | |
| CN | 110910774 A | | 3/2020 | |
| CN | 111048463 A | | 4/2020 | |
| JP | 5325938 B2 | * | 10/2013 | G02F 1/1345 |
| TW | 201133858 A | * | 10/2011 | H01L 27/1214 |
| WO | WO-2020/088230 A1 | | 5/2020 | |

* cited by examiner

DRIVING SUBSTRATE, METHOD FOR PREPARING THE SAME, AND DISPLAY DEVICE

CROSS-REFERENCE TO RELATED APPLICATION

This application is the U.S. national phase of PCT Application No. PCT/CN2020/090001 filed on May 13, 2020.

TECHNICAL FIELD

The present disclosure relates to the field of display technology, in particular to a driving substrate, a method for preparing the same, and a display device.

BACKGROUND

Micro-LED (Micro Light-Emitting Diode) display technology is to reduce the size of the existing LED (Light-Emitting Diode) to 100 µm or less, and then transfer it to a driving substrate through mass transfer technology to form a variety of different sizes of Micro-LED display. Micro-LED has many advantages such as self-illumination, high brightness, high contrast, super high resolution and color saturation, long life, fast response speed, energy saving, and wide adaptation to the environment. Thus, it has good application prospects in various fields.

SUMMARY

The embodiments of the present disclosure provide a driving substrate, a method for preparing the same, and a display device, which can reduce the number of patterning processes for preparing the driving substrate.

An embodiment of the present disclosure provides a technical solution as follows.

In one aspect, a driving substrate is provided, including: a base substrate; a first driving function layer arranged on a first surface of the base substrate, the first driving function layer including a plurality of driving thin film transistors and a plurality of signal wirings, and at least one of the plurality of signal wirings being of a single-layer structure and having a thickness greater than a threshold; a pad layer arranged on a surface of the first driving function layer away from the base substrate, the pad layer including a plurality of first pads and a plurality of second pads, and each of the plurality of first pads being connected to a first electrode of the corresponding driving thin film transistor and each of the plurality of second pads being connected to a common electrode line in the plurality of signal wirings.

In some embodiments, the driving substrate further includes: a second driving function layer arranged on a second surface of the base substrate, the second surface being opposite to the first surface, and the second driving function layer comprising a lead liner and a bonding pin connected to the lead liner; a plurality of grooves arranged in a side surface of the base substrate, each of the plurality of grooves extending in a direction perpendicular to the base substrate and penetrating through the first surface and the second surface of the base substrate; and a plurality of conductive connection portions corresponding to the plurality of grooves respectively, at least a part of the conductive connection portions being located in the corresponding grooves, and each conductive connection portion being configured to connect a corresponding signal wiring and a corresponding lead liner.

In some embodiments, the plurality of signal wirings includes a power supply voltage signal line and the common electrode line, and the power supply voltage signal line and the common electrode line each have a thickness greater than the threshold.

In some embodiments, the power supply voltage signal line and the common electrode line are arranged in a same layer and made of a same material.

In some embodiments, the driving substrate further includes a signal transmission line connected to the plurality of signal wirings, wherein the signal transmission line and the plurality of signal wirings form a grid structure.

In some embodiments, in a direction away from the first surface, the first driving function layer sequentially includes: an active layer; a first gate insulating layer; a first gate metal layer; a second gate insulating layer; a second gate metal layer; a first overcoat; a first source/drain metal layer; a second overcoat; a second source/drain metal layer, a pattern of the second source/drain metal layer comprising the plurality of signal wirings; and a third overcoat.

In some embodiments, the second source/drain metal layer includes a copper layer and a metal layer that are stacked, the metal layer is located on a surface of the copper layer proximate to the base substrate, and an adhesive force between the metal layer and the second overcoat is greater than an adhesive force between the copper layer and the second overcoat.

In some embodiments, the copper layer has a thickness in a range from 2 µm to 30 µm.

In some embodiments, the driving substrate further comprises a first passivation layer located between the copper layer and the first overcoat, wherein the first passivation layer is made of an inorganic insulating material.

In some embodiments, the driving substrate further includes a second passivation layer located between the copper layer and the second overcoat, wherein the second passivation layer is made of an inorganic insulating material.

In another aspect, a display device is provided, including the above driving substrate and an electronic component fixed on the pad layer, a first pole of the electronic component being bonded to the first pad, and a second pole of the electronic component being bonded to the second pad.

In another aspect, a method for preparing a driving substrate is provided, including: providing a base substrate; forming a first driving function layer on a first surface of the base substrate, the first driving function layer comprising a plurality of driving thin film transistors and a plurality of signal wirings, and at least one of the plurality of signal wirings being of a single-layer structure and having a thickness greater than a threshold; forming a pad layer on a surface of the first driving function layer away from the base substrate, the pad layer comprising a plurality of first pads and a plurality of second pads, and each of the plurality of first pads being connected to a first electrode of the corresponding driving thin film transistor and each of the plurality of second pads being connected to a common electrode line in the plurality of signal wirings.

In some embodiments, the driving substrate includes a pattern of a first source/drain metal layer and a pattern of a second source/drain metal layer, the pattern of the second source/drain metal layer includes the plurality of signal wirings, and the forming the signal wiring includes: forming a seed layer having a thickness less than a threshold; growing a conductive layer on the seed layer by an electroplating method, the seed layer and the conductive layer forming the second source/drain metal layer; patterning the second source/drain metal layer to form the plurality of signal wirings.

In some embodiments, the driving substrate includes a pattern of a first source/drain metal layer and a pattern of a second source/drain metal layer, the pattern of the second source/drain metal layer includes the plurality of signal wirings, and the forming the plurality of signal wirings includes: forming a seed layer having a thickness less than a threshold; patterning the seed layer to form a pattern of the seed layer, the pattern of the seed layer being located in the area where the plurality of signal wirings to be formed is located; growing a pattern of a conductive layer on the pattern of the seed layer by chemical plating, the pattern of the conductive layer and the pattern of the seed layer forming the signal wirings.

In some embodiments, the forming seed layer includes: forming a copper layer and a metal layer that are stacked, the metal layer being located on a surface of the copper layer proximate to the base substrate, and an adhesive force between the metal layer and the insulating layer being greater than an adhesive force between the copper layer and the insulating layer.

DETAILED DESCRIPTION

In order to make the technical problem to be solved, the technical solution, and the advantages of the examples of the present disclosure clearer, the present disclosure will be described hereinafter in conjunction with the drawings and specific examples.

The current load of the driving substrate of the Micro-LED display is large, which can reach tens of milliamps, and thus there are high requirements on the line width and resistance of the signal wirings. If the resistance of the signal wirings is too large, the electrical signal loss on the signal wiring will be large, and further the power consumption of the driving substrate will be high.

Figure 1:
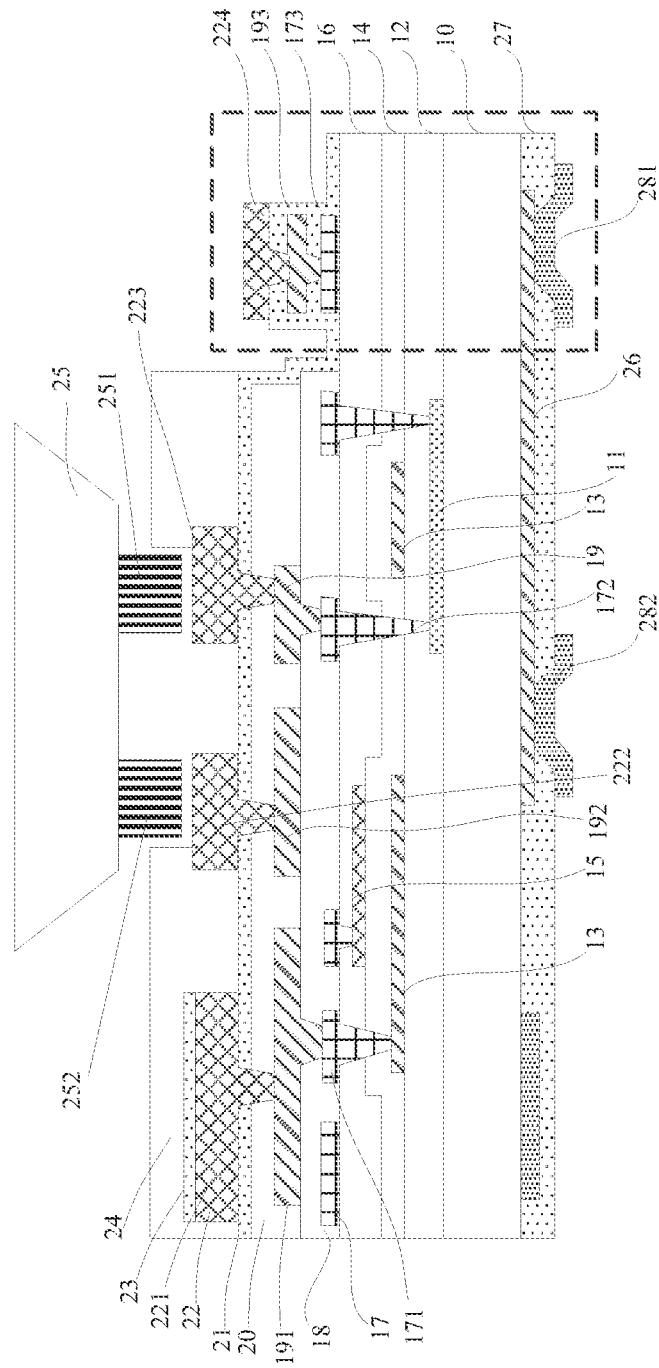
FIG. 1 is a schematic view showing a driving substrate in the related art.

FIG. 1 is a schematic view showing a driving substrate in the related art. As shown in FIG. 1, the driving substrate includes a base substrate 10, a first driving function layer located on a first surface of the base substrate 10, and a second driving function layer located on a second surface of the base substrate 10, in which the first surface and the second surfaces are two opposite surfaces. Among them, the first driving function layer includes: an active layer 11, in which the active layer 11 may be made of polysilicon, and the thickness is roughly in a range from 400 to 500 angstroms; a first gate insulating layer 12, in which the first gate insulating layer 12 may be made of inorganic insulating materials such as silicon nitride, silicon oxide, or silicon oxynitride, and the thickness is roughly in a range from 400 to 800 angstroms; a first gate metal layer 13, in which the first gate metal layer 13 may be made of Mo, and the thickness is roughly in a range from 2500 to 3600 angstroms; a second gate insulating layer 14, in which the second gate insulating layer 14 may be made of inorganic insulating materials, such as silicon nitride, silicon oxide, or silicon oxynitride, and the thickness is roughly in a range from 1000 to 2000 angstroms; a second gate metal layer 15, in which the second gate metal layer 15 can be made of Mo, and the thickness is roughly in a range from 2500 to 3600 angstroms; an interlayer insulating layer 16, in which the interlayer insulating layer 16 can be made of inorganic insulating materials, such as silicon nitride, silicon oxide, or silicon oxynitride, and the thickness is roughly in a range from 2000 to 3000 angstroms; a first source/drain metal layer 17, in which the first source/drain metal layer 17 may be of a laminated structure of titanium/aluminum/titanium, and the thickness may be 500 angstroms/5000 angstroms/500 angstroms, respectively; a first overcoat 18, in which the first overcoat 18 may be made of organic resin, and the thickness is roughly in a range from 18000 to 22000 angstroms; a second source/drain metal layer 19, in which the second source/drain metal layer 19 may be of a stacked structure of titanium/aluminum/titanium, and the thickness may be 500 angstroms/6500 angstroms/500 angstroms, respectively; a second overcoat 20, in which the second overcoat 20 can be made of organic resin, and the thickness is roughly in a range from 18000 to 22000 angstroms; a first passivation layer 21, in which the first passivation layer 21 can be made of inorganic insulating materials, such as silicon nitride, silicon oxide, or silicon oxynitride, and the thickness is roughly in a range from 2000 to 3000 angstroms; a third source/drain metal layer 22, in which the third source/drain metal layer 22 may be made of copper, and the thickness is roughly in a range from 5500 to 6500 angstroms; a second passivation layer 23, in which the second passivation layer 23 can be made of inorganic insulating materials, such as silicon nitride, silicon oxide, or silicon oxynitride, and the thickness is roughly in a range from 2000 to 3000 angstroms; a third overcoat 24, in which the third overcoat 24 can be made of organic resin, and the thickness is roughly in a range from 18000 to 22000 angstroms. Further, the first driving function layer may also include a buffer layer located between the active layer 11 and the base substrate 10 (not shown), in which the buffer layer can be made of inorganic insulating materials, such as silicon nitride, silicon oxide, or silicon oxynitride, specifically has a stack structure of silicon nitride/silicon oxide, the thickness can be 500 angstroms/3000 angstroms respectively.

The first source/drain metal layer 17 is used to prepare data lines. The first source/drain metal layer 17 further includes a first sub-pattern 171 and a second sub-pattern 172, in which the first sub-pattern 171 is used to transmit a VDD (power supply voltage) signal; and the second sub-pattern 172 is used to transmit the driving voltage signal. The second source/drain metal layer 19 includes a third sub-pattern 191 and a fourth sub-pattern 192, in which the third sub-pattern 191 is used to transmit the VDD signal; and the fourth sub-pattern 192 is used to transmit VSS (low voltage) signal. The third source/drain metal layer 22 includes a fifth sub-pattern 221, a sixth sub-pattern 222, and a seventh sub-pattern 223, in which the fifth sub-pattern 221 is used to transmit the VDD signal; the sixth sub-pattern 222 is used to transmit the VSS signal; and the seventh sub-pattern 223 is used to transmit the driving voltage signal. The third overcoat 24 includes via holes exposing the sixth sub-pattern 222 and the seventh sub-pattern 223, in which the sixth sub-pattern 222 and the seventh sub-pattern 223 can be used as pads. The N pad 252 of the LED 25 can be bound to the sixth sub-pattern 222, and the P pad 251 of the LED 25 can be bound to the seventh sub-pattern 223.

The second driving function layer includes: a fan-out wiring structure 26, in which the fan-out wiring structure 26 can adopt Al/Mo stacked structure, and the thickness can be 6000 angstroms/600 angstroms respectively; a passivation layer 27, in which passivation layer 27 can be made of inorganic insulating materials, such as silicon oxide, silicon oxide, or silicon oxynitride, and the thickness is roughly in a range from 5000 to 7000 angstroms; a bonding pins 282 configured to bind the flexible circuit board, and a lead liner 281 connected to the bonding pins 282 through the fan-out wiring structure 26, which can be made of a transparent conductive material such as ITO, and the thickness is roughly in a range from 400 to 600 angstroms.

It can be understood that since a plurality of bonding pins 282 will be bound to the terminals of the flexible circuit board, a plurality of lead liners 281 are connected in parallel with the first conductive sub-pattern 312 and the second conductive sub-pattern 344 to form a conductive structure in a one-to-one correspondence, and an orthogonal projection of the plurality of lead liners 281 on the plane of the substrate basically coincides with the conductive structure. Therefore, the arrangement pitch of two adjacent lead liners 281 among the plurality of lead liners 281 is larger than the arrangement pitch of two adjacent bonding pins 282 among the plurality of lead liners 282.

In addition, the first source/drain metal layer 17 further includes an eighth sub-pattern 173, the second source/drain metal layer 19 further includes a ninth sub-pattern 193, and the third source/drain metal layer 22 further includes a tenth sub-pattern 224, in which the eight sub-pattern 173, the ninth sub-pattern 193, and the tenth sub-pattern 224 form a conductive structure. By connecting to the lead liner 281 along the groove on the side surface of the base substrate 10, the signal output from the flexible circuit board is transmitted to the VDD wiring and the VSS wiring.

As can be seen from the driving substrate shown in FIG. 1, in order to reduce IR Drop, two metal layers (the third sub-pattern 191 and the fifth sub-pattern 221) are connected in parallel to form a VDD wiring, and three source/drain metal layers are arranged on the driving substrate, the structure of the driving substrate is relatively complicated, leading to a large number of patterning processes for preparing the driving substrate, which affects the production cycle of the driving substrate, and causes the production cost of the driving substrate to be relatively high.

The embodiments of the present disclosure provide a driving substrate, a method for preparing the same, and a display device, which can reduce the number of patterning processes for preparing the driving substrate.

An embodiment of the present disclosure provides a driving substrate, including: a base substrate; a first driving function layer arranged on a first surface of the base substrate, the first driving function layer including a plurality of driving thin film transistors and a plurality of signal wirings, and at least one of the plurality of signal wirings being of a single-layer structure and having a thickness greater than a threshold; a pad layer arranged on a surface of the first driving function layer away from the base substrate, the pad layer including a plurality of first pads and a plurality of second pads, and each of the plurality of first pads being connected to a first electrode of the corresponding plurality of driving thin film transistors and each of the plurality of second pads being connected to a common electrode line in the signal wiring.

In this embodiment, the thickness of the signal wiring itself is relatively large, which can effectively reduce IR Drop, so there is no need to form signal wirings connected in parallel, which can reduce the number of metal layers included in the driving substrate, thereby reducing the number of patterning processes for preparing the driving substrate, and reducing the production cost of the driving substrate.

Specifically, the above threshold may be 2 μm.

The signal wiring of the driving substrate includes a power supply voltage signal line VDD wiring and a common electrode line VSS wiring. The VDD wiring is used to transmit the first fixed-level signal, and the VSS wiring is used to transmit the second fixed-level signal. If the resistances of the VDD wiring and the VSS wiring are relatively large, it will result in higher power consumption of the driving substrate (larger IR Drop), in which the amplitude of the first fixed-level signal differs from the amplitude of the second fixed-level signal.

In the related art shown in FIG. 1, the second source/drain metal layer 19 may be of a stacked structure of titanium/aluminum/titanium, and the thickness may be 500 angstroms/6500 angstroms/500 angstroms respectively, and the third source/drain metal layer 22 may be made of copper with a thickness of 6000 angstroms, the second source/drain metal layer 19 and the third source/drain metal layer 22 are connected in parallel to form a signal wiring (such as VDD wiring and VSS wiring), and the resistivity of the signal wiring is about 0.0035 ohm·meter. In this embodiment, a single layer of conductive material, such as copper, with a thickness greater than 2 μm is directly used to prepare the signal wiring, which can reduce the resistivity of the signal wiring to about 0.001 ohm·meter and can greatly reduce the resistivity of the signal wiring, thereby not only reducing the IR Drop of the signal wiring, but also saving the process flow.

In some embodiments, the power supply voltage signal line and the common electrode line can be arranged in the same layer and made of the same material, so that the power supply voltage signal line and the common electrode line can be formed through a single patterning process, thereby reducing the number of patterning processes for preparing the driving substrate.

Figure 2:
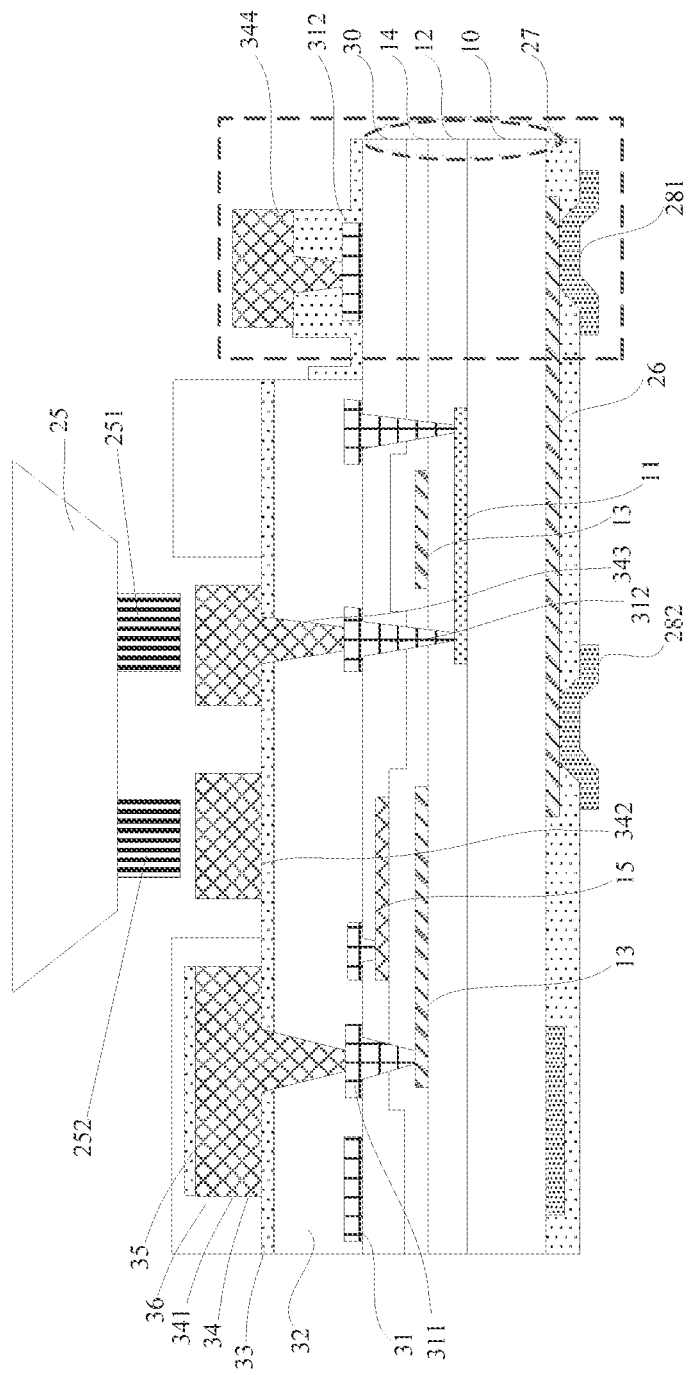
FIG. 2 is a schematic view showing the driving substrate according to one embodiment of the present disclosure.

As shown in FIG. 2, in a specific embodiment, taking the electronic component as an LED as an example, the driving substrate includes: a base substrate 10, a first driving function layer located on a first surface of the base substrate 10, and a second driving function layer located on a second surface of the base substrate 10, in which the first surface and the second surfaces are two opposite surfaces.

Among them, the first driving function layer includes: an active layer 11, in which the active layer 11 can be made of P—Si, and the thickness is roughly in a range from 400 to 500 angstroms, specifically 470 angstroms; a first gate insulating layer 12, in which the first gate insulating layer 12 can be made of inorganic insulating materials, such as silicon nitride, silicon oxide, or silicon oxynitride, and the thickness is roughly in a range from 400 to 800 angstroms, specifically, it can be made of a stacked structure of silicon oxide/silicon nitride and the thicknesses are 800 angstroms and 400 angstroms respectively; a first gate metal layer 13, in which a pattern of the first gate metal layer 13 includes the gate line and the gate electrode of the thin film transistor, etc., the first gate metal layer 13 can be made of Mo, and the thickness is roughly in a range from 2500 to 3600 angstroms, specifically 3100 angstroms; a second gate insulating layer 14, in which the second gate insulating layer 14 can be made of inorganic insulating materials, such as silicon nitride, silicon oxide, or silicon oxynitride, and the thickness is roughly in a range from 1000 to 2000 angstroms, and specifically 1400 angstroms; a second gate metal layer 15, in which a pattern of the second gate metal layer 15 includes the plate of the storage capacitor, the second gate metal layer 15 can be made of Mo, and the thickness is roughly in a range from 2500 to 3600 angstroms, specifically 3100 angstroms; a first overcoat 30, in which the first overcoat 30 can be made of organic resin, and the thickness is roughly in a range from 18000 to 22000 angstroms; a first source/drain metal layer 31, in which the pattern of the first source/drain metal layer 31 includes a connecting line 311 and the first electrode 312 of the driving thin film transistor, in which the connecting line 311 is used to transmit VDD signal, the first electrode can be a source electrode or a drain electrode, the first source/drain metal layer 31 can also be used to prepare data lines, the first source/drain metal layer 31 can be made of a stacked structure of titanium/aluminum/titanium, and the thickness can be 500 angstroms/5000 angstroms/500 angstroms respectively; the second overcoat 32, in which the second overcoat 32 can be made of organic resin, and the thickness is roughly in a range from 18000 to 22000 angstroms; a second source/drain metal layer 34, in which the second source/drain metal layer 34 has a thickness greater than the threshold, a pattern of the second source/drain metal layer 34 includes a signal wiring and a second pad 343, the signal wiring includes VDD wiring 341 and VSS wiring 342, the VSS wiring 342 also serving as the first pad, and the second pad 343 being connected to the first electrode 312 of the driving thin film transistor; and a third overcoat 36, in which the third overcoat 36 can be made of organic resin, and the thickness is roughly in a range from 18000 to 22000 angstroms.

Further, the first driving function layer may also include a buffer layer located between the active layer 11 and the base substrate 10 (not shown), in which the buffer layer can be made of inorganic insulating materials, such as silicon nitride, silicon oxide, or silicon oxynitride, specifically a stack structure of silicon nitride/silicon oxide, the thickness can be 500 angstroms/3000 angstroms respectively. The buffer layer can prevent impurities on the base substrate 10 from entering the active layer 11 and further affecting the performance of the thin film transistor.

Among them, the third overcoat 36 includes a via hole exposing part of the surface of the VSS wiring 342 and the second pad 343, in which the N pad 252 of the LED 25 can be bound to the VSS wiring 342, and the P pad 251 of the LED 25 can be bound to the first pad 343.

Due to the large current load of the driving substrate, which can reach tens of milliamps, the resistance performance of the signal wiring is high, and a metal with a smaller resistance is required, otherwise the heat of the wiring will cause excessive temperature; and the copper has superior conductivity, and thus copper is used as the main body of the signal wiring. Of course, the signal wiring is not limited to be made of copper, and other metals such as silver and aluminum can also be used. The thickness of the copper layer can be adjusted according to the size of the current load. The greater the current load, the greater the thickness of the copper layer. The thickness of the copper layer may be in a range from 2 to 30 μm, and in some embodiments, it may be 2 μm specifically. The copper layer can be completed by sputtering, electroplating, chemical plating, etc.

When a copper layer is formed on the second overcoat 32 by sputtering, the plasma during the sputtering may damage the second overcoat 32, causing the debris of second overcoat 32 to fall off, thereby contaminating the sputtering chamber. In order to avoid this situation, as shown in FIG. 2, the driving substrate further includes a first passivation layer 33 on the second overcoat 32, and the first passivation layer 33 can protect the second overcoat 32. The first passivation layer 33 can be made of inorganic insulating materials, such as silicon nitride, silicon oxide, or silicon oxynitride, and the thickness of the first passivation layer 33 is roughly in a range from 500 to 3000 angstroms.

If the copper layer is formed by low-temperature deposition, since the low-temperature deposition will not cause damage to the second overcoat 32, the provision of the first passivation layer 33 can be omitted at this time.

In addition, when the signal wiring is made of copper, and the third overcoat 36 is formed on the signal wiring, the third overcoat 36 will oxidize the surface of the copper when it is cured at a high temperature. In order to avoid this situation, as shown in FIG. 2, the driving substrate further includes a second passivation layer 35 on the second source/drain metal layer 34, in which the second passivation layer 35 can protect the copper and prevent the surface of the copper from being oxidized when the third overcoat 36 is cured at a high temperature. The second passivation layer 35 can be made of inorganic insulating materials, such as silicon nitride, silicon oxide, or silicon oxynitride, and the thickness of the second passivation layer 35 is roughly in a range from 500 to 3000 angstroms. Since the N pad 252 of the LED 25 needs to be bonded to the first pad in the subsequent process and the P pad 251 of the LED 25 needs to be bonded to the second pad 343, the first pad and the second pad 343 may be not provided with the second passivation layer 35; or, the second passivation layer 35 is also provided on the first pad and the second pad 343, but the second passivation layer 35 on the first pad and the second pad 343 is removed before bonding the LED 25.

In some embodiments, in addition to the copper layer, the second source/drain metal layer 34 also includes a metal layer on a surface of the copper layer proximate to the base substrate, in which the adhesive force between the metal layer and the second overcoat 32 is greater than the adhesion force between the copper layer and the second overcoat 32 to prevent the copper layer from falling off from the base substrate. Specifically, the metal layer may be made of at least one of: Mo, MoNb, MoTi, MoWu, MoNi, and MoNiTi; and may also be made of metal oxides, such as IGZO, IZO, GZO, or ITO. The thickness of the metal layer is rough in a range from 200 to 500 angstroms.

The second driving function layer includes: a fan-out wiring structure 26, in which the fan-out wiring structure 26 can adopt Al/Mo stacked structure, and the thickness can be 6000 angstroms/600 angstroms respectively; a passivation layer 27, in which passivation layer 27 can be made of inorganic insulating materials, such as silicon nitride, silicon oxide, or silicon oxynitride, and the thickness is roughly in a range from 5000 to 7000 angstroms; a bonding pins 282 configured to bind the flexible circuit board and a lead liner 281 connected to the bonding pins 282 through the fan-out wiring structure 26, which can be made of a transparent conductive material such as ITO, and the thickness is roughly in a range from 400 to 600 angstroms.

In addition, in the first driving function layer, the first source/drain metal layer 31 further includes a first conductive sub-pattern 312, and the second source/drain metal layer 34 further includes a second conductive sub-pattern 344, in which the first conductive sub-pattern 312 and the second conductive sub-pattern 344 are connected in parallel to form a conductive structure, which is connected to the signal wiring in the display area; the conductive structure can be connected to the lead liner 281 through the conductive connection portion on the side surface (the area shown by the elliptical dashed line frame) of the substrate, thereby realizing the connection between the lead liner 281 and the signal wiring to transfer the signal output from the flexible circuit board to the signal wiring. If the conductive connection portion is exposed outside the substrate, it is easily damaged. In order to avoid damage to the conductive connection portion, a groove corresponding to the position where the conductive connection portion is located, e.g., the area shown by the elliptical dashed frame, can be provided on the side surface of the substrate, so that at least a part of the conductive connection portion is located in the groove, thereby reducing the risk of damage to conductive connection portion.

In the related art, in order to reduce the IR Drop of the signal wiring, one source/drain metal layer used to form the signal wiring among the three source/drain metal layers basically covers the entire display area of the substrate. In addition, the thickness of the insulating layer between the two source/drain metal layers is small, and the probability of a short-circuit failure between the two source/drain metal layers is relatively high, which will lead to problems in the subsequent processes, e.g., when the third overcoat 36 is prepared by chemical vapor deposition, static charges will accumulate on the large-area metal layer, which will cause arc discharge, thereby damaging the machine and affecting the yield of the driving substrate.

Figure 3:
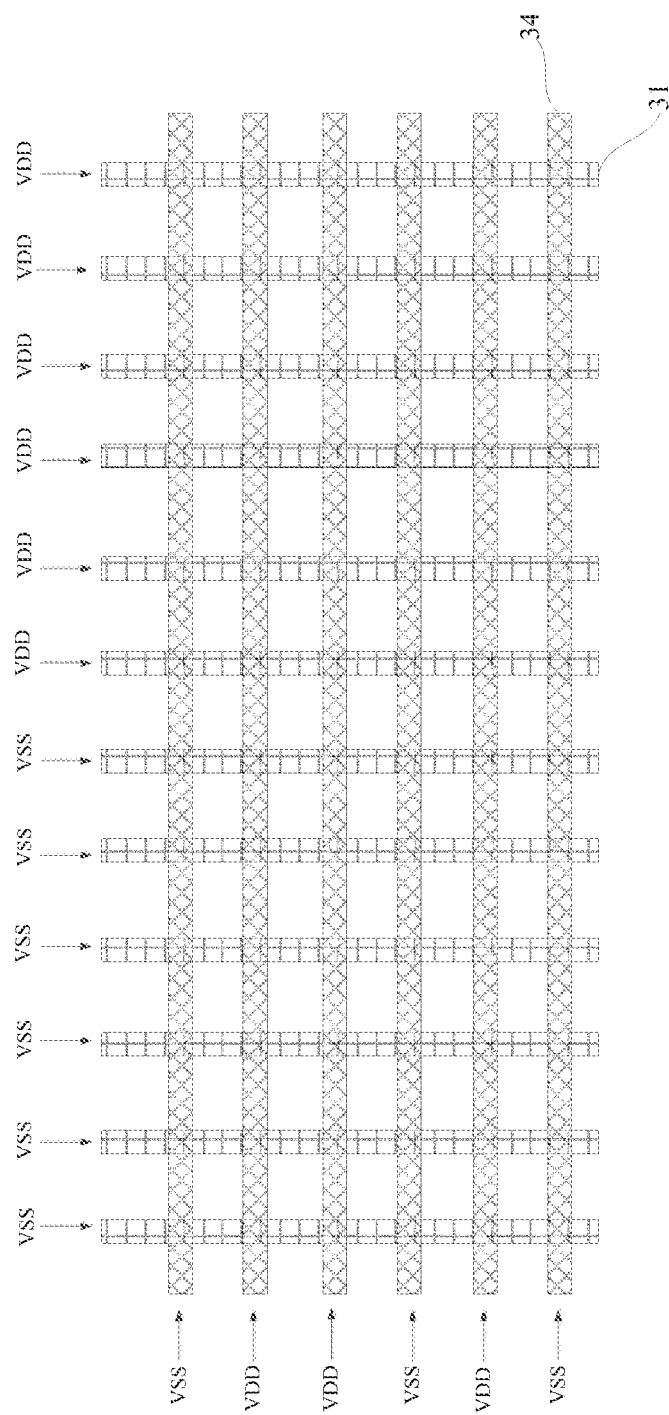
FIG. 3 is a schematic view showing the wiring of the driving substrate in the display area according to one embodiment of the present disclosure.

As shown in FIG. 3, in this embodiment, the first source/drain metal layer 31 is used to prepare a signal transmission line, and the signal transmission line is connected to the signal wiring made of the second source/drain metal layer 34 to form a grid structure, in which the signal wiring prepared by the source/drain metal layer 34 includes VSS wiring and VDD wiring. A part of the signal transmission lines are connected to the VSS wiring to form a grid structure, so as to transmit VSS signals, in which the signal transmission lines for transmitting VSS signals is connected to the corresponding VSS wiring at the intersections through via holes penetrating through the second overcoat 32; and another part of the signal transmission lines are connected to VDD wiring to form a grid structure to transmit VDD signals, in which the signal transmission lines for transmitting VDD signals are connected to the corresponding VDD wiring at the intersections through via holes penetrating through the second overcoat 32. Since in this embodiment a single-layer source/drain metal layer is used to prepare the signal wiring, the incidence of short-circuit failure can be reduced to less than 1%, thereby ensuring the yield of the driving substrate. In addition, in this embodiment, since the number of source/drain metal layers included in the driving substrate is relatively small, even if the width of the signal wiring prepared using the second source/drain metal layer 34 increases and the occupied area increases, it will not cause the incidence of short-circuit failure to be increased significantly.

Figure 4:
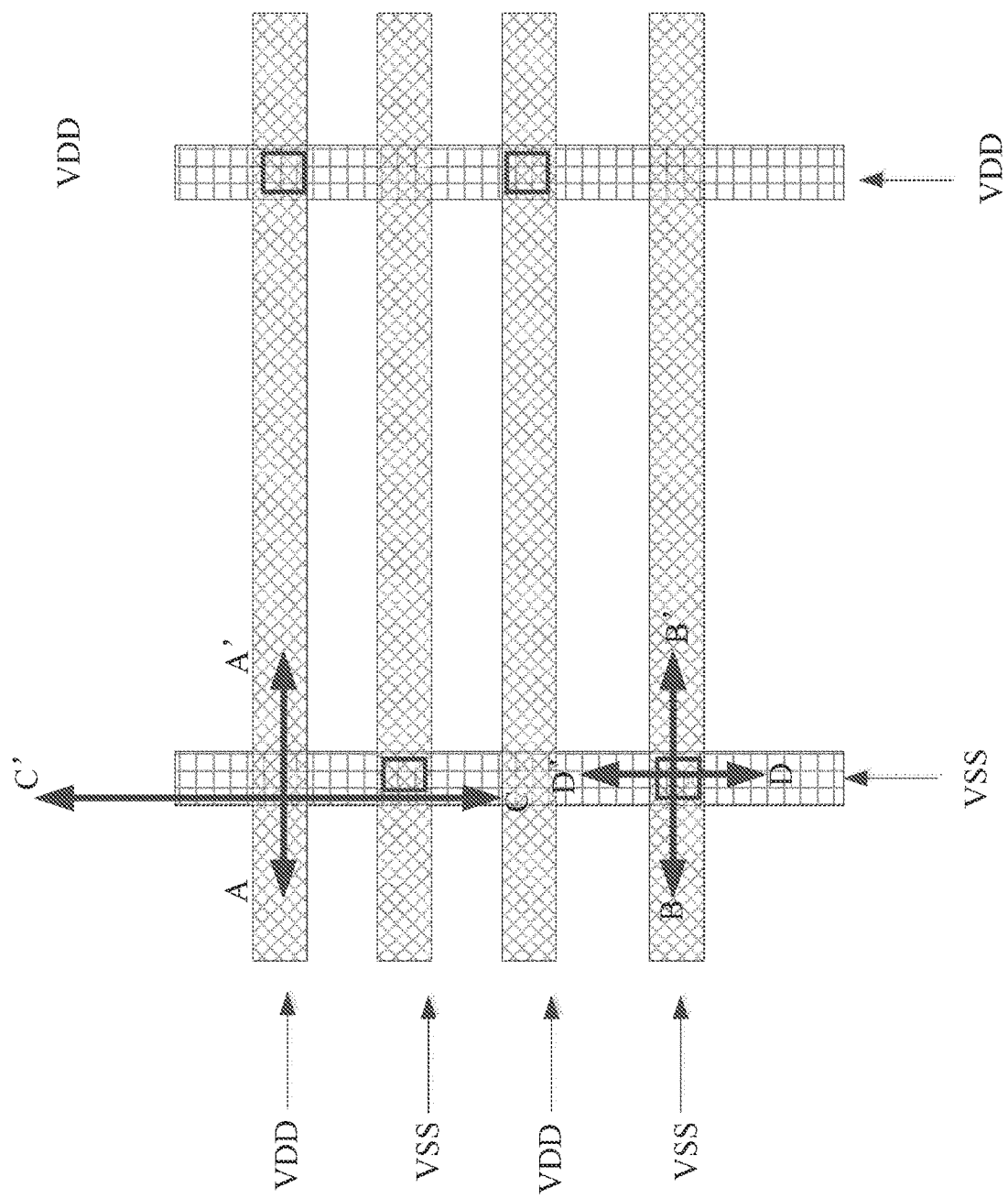
FIG. 4 is a partial enlarged view of FIG. 3.
Figure 5:
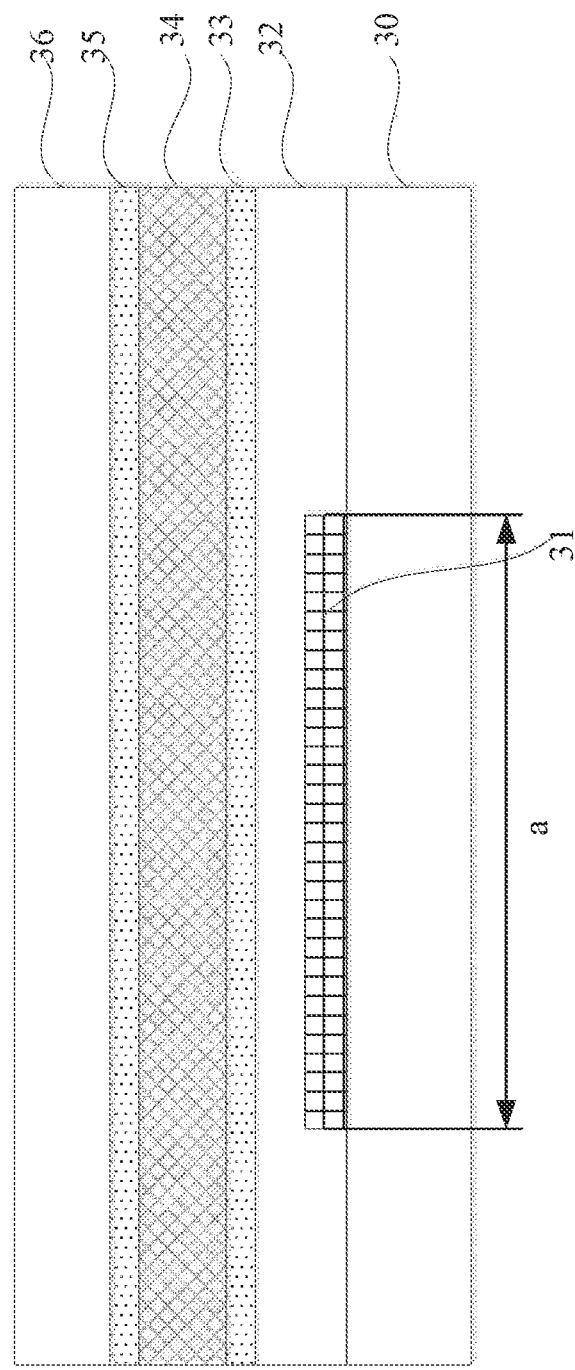
FIG. 5 is a schematic view showing the cross section taken along the direction AA' in FIG. 4.
Figure 6:
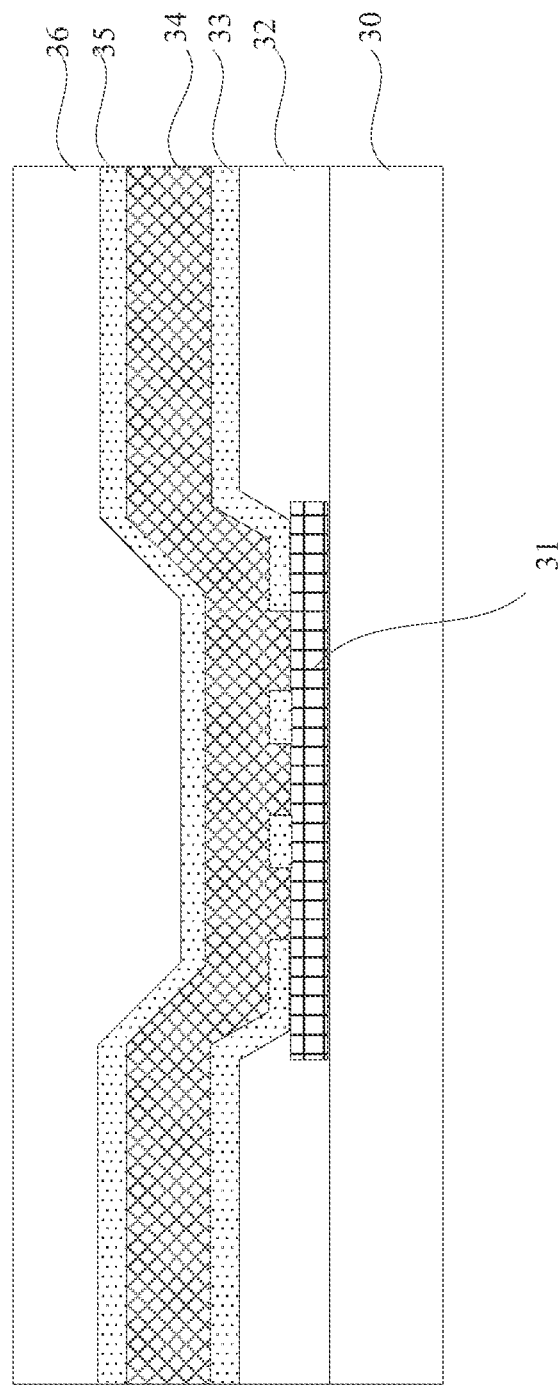
FIG. 6 is a schematic view showing the cross section taken along the direction BB' in FIG. 4.
Figure 7:
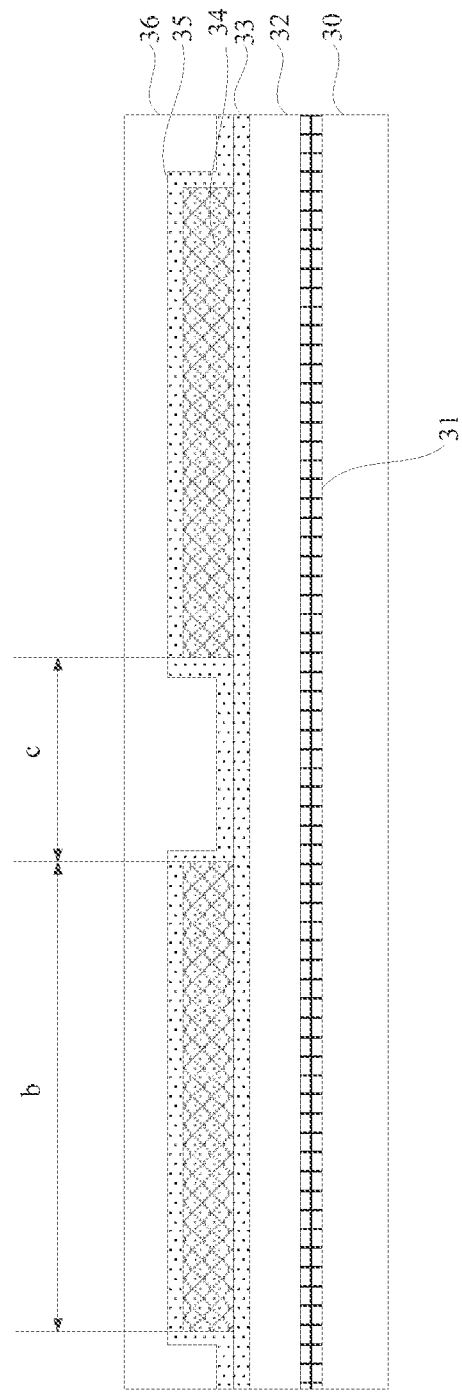
FIG. 7 is a schematic view showing the cross section taken along the direction CC' in FIG. 4.
Figure 8:
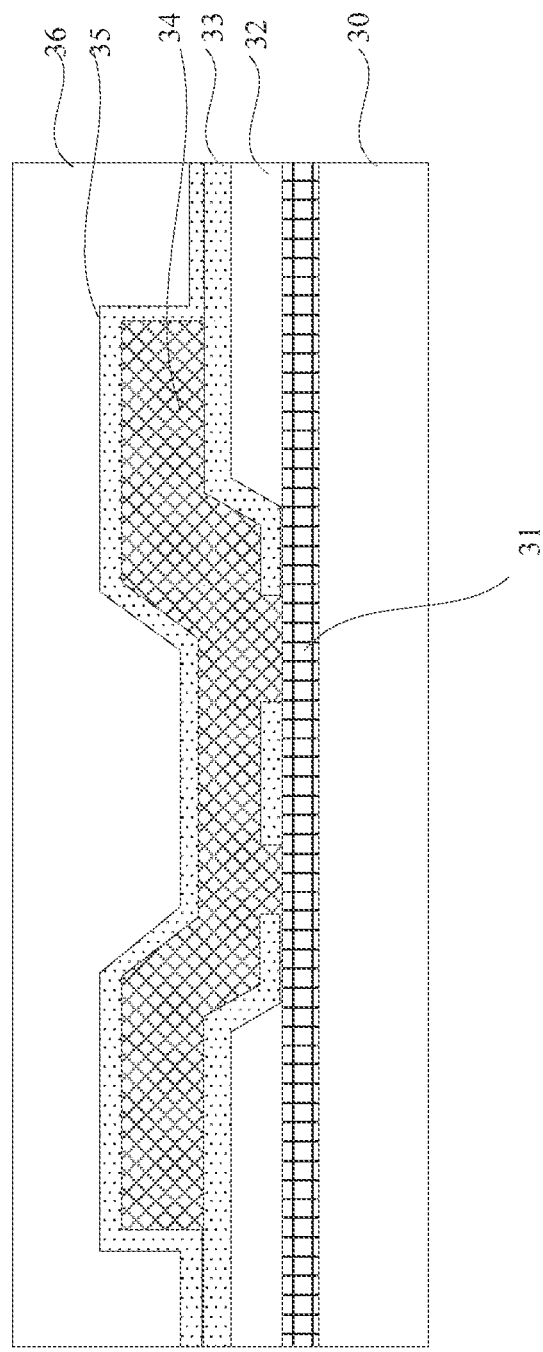
FIG. 8 is a schematic view showing the cross section taken along the direction DD' in FIG. 4.

FIG. 4 is a partial enlarged schematic view of FIG. 3, FIG. 5 is a schematic view showing the cross section taken along the direction AA' in FIG. 4, FIG. 6 is a schematic view showing the cross section taken along the direction BB' in FIG. 4, FIG. 7 is a schematic view showing the cross section taken along the direction CC' in FIG. 4, and FIG. 8 is a schematic view showing the cross section taken along the direction DD' in FIG. 4.

As shown in FIG. 5, the line width of the signal transmission line formed by the first source/drain metal layer 31 is a. As shown in FIG. 7, the line width of the signal wiring formed by the second source/drain metal layer 34 is b, and the spacing between the signal wirings is c, where the value of a/b is 1-1.2, and specifically can be 1.1; the value of b/c is 1.8-2.2, and specifically can be 2. The above parameters are used to design the line width of the signal transmission line, the line width and the spacing of signal wiring, thereby reducing the transmission loss of VSS signal and VDD signal, and also reducing the incidence of short-circuit failure.

Figure 9:
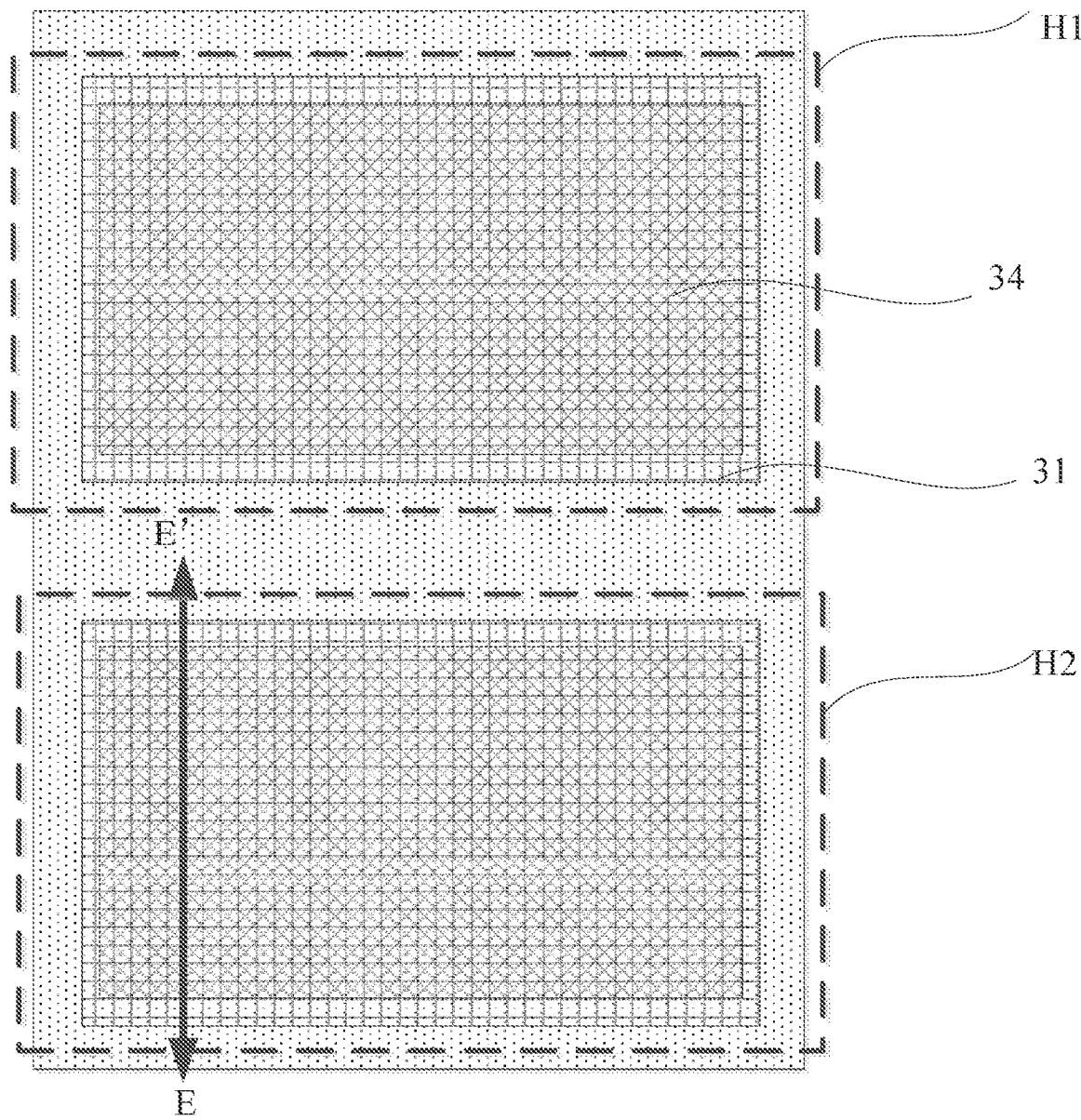
FIG. 9 is a schematic view showing the pad area of the driving substrate according to one embodiment of the present disclosure.
Figure 10:
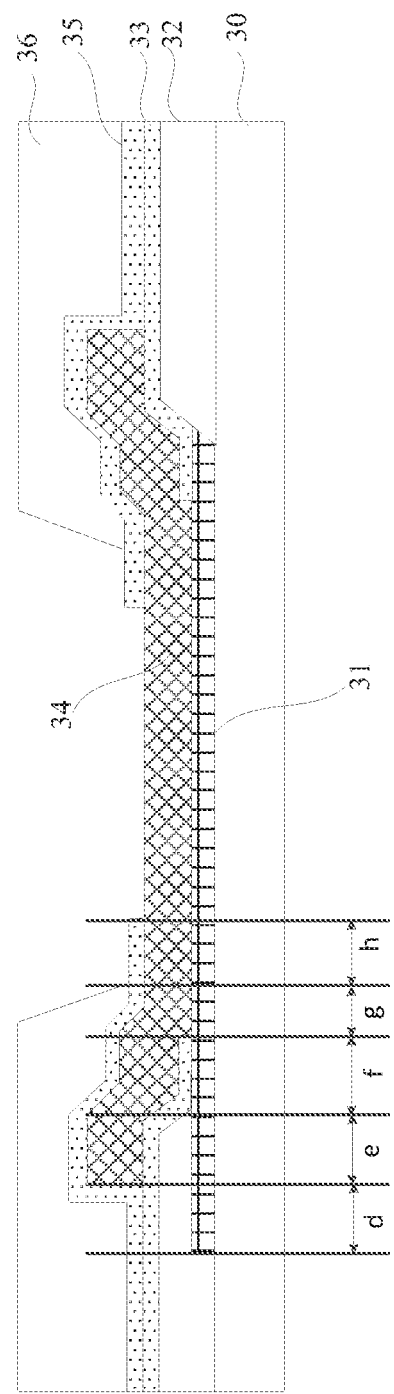
FIG. 10 is a schematic view showing the cross section taken along the direction EE' in FIG. 9.

FIG. 9 is a schematic view showing the driving substrate in the pad area of the embodiment of the present disclosure, and FIG. 10 is a schematic cross-sectional view taken along the direction EE' in FIG. 9. The pad area includes a first pad area H1 and a second pad area H2, in which the first pad area H1 is provided with a first pad, and a second pad area H2 is provided with a second pad. As shown in FIG. 10, where d is the horizontal distance between the edge of the first source/drain metal layer 31 and the edge of the second source/drain metal layer 34, and e is the horizontal distance between the edge of the second source/drain metal layer 34 and the edge of the second overcoat 32, f is the horizontal distance between the edge of the second overcoat 32 and the edge of the first passivation layer 33, g is the horizontal distance between the edge of the first passivation layer 33 and the edge of the third overcoat 36, and h is the horizontal distance between the edge of the third overcoat 36 and the edge of the second passivation layer 35. Among them, the value of e/d is 1.4-1.6, and specifically 1.5; the value of f/e is 1.4-1.6, and specifically 1.5; the value of f/g is 1.4-1.6, and specifically 1.5; the value of h/g is 1.4-1.8, and specifically 1.67. The above parameters is used to design the structure of the overlap between the first source/drain metal layer 31 and the second source/drain metal layer 34, thereby ensuring the connection yield of the first source/drain metal layer 31 and the second source/drain metal layer 34.

An embodiment of the present disclosure also provides a display device, including the above driving substrate and an electronic component fixed on the pad layer, a first pole of the electronic component being bonded to the first pad, and a second pole of the electronic component being bonded to the second pad.

Specifically, the electronic component is an LED. As shown in FIG. 2, the N pad 252 of the LED 25 can be bound to the first pad, and the P pad 251 of the LED 25 can be bound to the second pad 343.

The display device may be any product or component having a display function, such as a television, a display, a digital photo frame, a mobile phone, a tablet computer, etc., in which the display device further includes a flexible circuit board, a printed circuit board, and a backplane, in which flexible circuit board is bound to the bonding pins 282.

An embodiment of the present disclosure further provides a method for preparing a driving substrate, including:

providing a base substrate;

forming a first driving function layer on a first surface of the base substrate, the first driving function layer including a plurality of driving thin film transistors and a plurality of signal wirings, and at least one of the plurality of signal wirings being of a single-layer structure and having a thickness greater than a threshold;

forming a pad layer on a surface of the first driving function layer away from the base substrate, the pad layer including a plurality of first pads and a plurality of second pads, and each of the plurality of first pads being connected to a first electrode of the corresponding driving thin film transistor and each of the plurality of second pads being connected to a common electrode line in the signal wiring.

In this embodiment, the thickness of the signal wiring itself is relatively large, which can effectively reduce IR Drop, so there is no need to form signal wirings connected in parallel, which can reduce the number of metal layers included in the driving substrate, thereby reducing the number of patterning processes for preparing the driving substrate, and reducing the production cost of the driving substrate.

The method for preparing the driving substrate according to embodiments of the present disclosure is used for preparing the driving substrate according to the above embodiments.

Due to the large current load of the driving substrate, which can reach tens of milliamps, the resistance performance of the signal wiring is high, and a metal with a smaller resistance is required, otherwise the heat of the wiring will cause excessive temperature; and the copper has superior conductivity, and thus copper is used as the main body of the signal wiring. Of course, the signal wiring is not limited to be made of copper, and other metals such as silver and aluminum can also be used. The thickness of the copper layer can be adjusted according to the size of the current load. The greater the current load, the greater the thickness of the copper layer. The thickness of the copper layer may be in a range from 2 to 30 μm, and in some embodiments, it may be 2 μm specifically. The copper layer can be completed by sputtering, electroplating, chemical plating, etc.

In one embodiment, copper is used to prepare a signal wiring, which is sputtered to form a relatively thick copper layer, and an LED is used as an example of the electronic component, the method for preparing the driving substrate specifically includes the following steps.

Step 1. providing a base substrate 10, and forming a buffer layer and an active layer 11 on the base substrate 10;

Among them, the base substrate 10 may be a glass substrate, a quartz substrate or a flexible substrate.

A plasma-enhanced chemical vapor deposition (PECVD) method can be used to form a buffer layer on the base substrate 10. The buffer layer can be made of oxides, nitrides or oxynitrides, and the corresponding reaction gas is $SiH_4$, $NH_3$, $N_2$ or $SiH_2Cl_2$, $NH_3$, $N_2$. Specifically, the buffer layer may be of a laminated structure of silicon nitride/silicon oxide, and the thickness may be 500 angstroms/3000 angstroms respectively.

A semiconductor material is formed on the buffer layer, and the semiconductor material is patterned to form the active layer 11. The active layer 11 may be made of P—Si, and the thickness may be in a range from 400 to 500 angstroms, and specifically 470 angstroms.

Step 2. forming the first gate insulating layer 12;

Specifically, PECVD can be used to deposit the first gate insulating layer 12 having a thickness in a range from 400 to 800 angstroms. The first gate insulating layer 12 can be made of oxides, nitrides or oxynitrides, and the corresponding reaction gas is $SiH_4$, $NH_3$, $N_2$ or $SiH_2Cl_2$, $NH_3$, $N_2$.

Step 3. forming a pattern of the first gate metal layer 13;

Specifically, sputtering or thermal evaporation may be used to deposit the first gate metal layer 13 having a thickness in a range from 2500 to 3600 angstroms. The first gate metal layer 13 may be made of Cu, Al, Ag, Mo, Cr, Nd, Ni, Mn, Ti, Ta, W and other metals and alloys of these metals, and specifically Mo can be used. A layer of photoresist is coated on the first gate metal layer 13, and the photoresist is exposed by using a mask to form a photoresist unreserved area and a photoresist reserved area, in which the photoresist reserved area corresponds to the area where the pattern of the first gate metal layer 13 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the first gate metal layer 13 of the photoresist unreserved area is completely etched away by an etching process, and the remaining photoresist is stripped to form a pattern of the first gate metal layer 13. The pattern of the first gate metal layer 3 includes a gate line and a gate electrode of a thin film transistor.

Step 4: forming a second gate insulating layer 14;

Specifically, PECVD can be used to deposit the second gate insulating layer 14 having a thickness in a range from 1000 to 2000 angstroms. The second gate insulating layer 14 can be made of oxides, nitrides or oxynitrides, and the corresponding reaction gas is $SiH_4$, $NH_3$, $N_2$ or $SiH_2Cl_2$, $NH_3$, $N_2$.

Step 5. forming a pattern of the second gate metal layer 15;

Specifically, sputtering or thermal evaporation may be used to deposit the second gate metal layer 15 having a thickness in a range from 2500 to 3600 angstroms. The second gate metal layer 15 may be made of Cu, Al, Ag, Mo, Cr, Nd, Ni, Mn, Ti, Ta, W and other metals and alloys of these metals, and specifically Mo can be used. A layer of photoresist is coated on the second gate metal layer 15, and the photoresist is exposed by using a mask to form a photoresist unreserved area and a photoresist reserved area, in which the photoresist reserved area corresponds to an area where the pattern of the gate metal layer 15 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the second gate metal layer 15 of the photoresist unreserved area is completely etched away by an etching process, and the remaining photoresist is stripped to form a pattern of the second gate metal layer 15. The pattern of the second gate metal layer 15 includes a plate of the storage capacitor and the like.

Step 6. forming the first overcoat 30;

Specifically, a layer of organic resin having a thickness in a range from 18000 to 22000 angstroms can be coated, and cured at a high temperature to form the first overcoat 30.

Step 7. forming a pattern of the first source/drain metal layer 31;

Specifically, by magnetron sputtering, thermal evaporation or other film formation methods, a source/drain metal layer having a thickness of approximately 5000 to 6000 Å may be deposited. The source/drain metal layer may be a metal such as Cu, Al, Ag, Mo, Cr, Nd, Ni, Mn, Ti, Ta, and W, and an alloy of these metals. The source/drain metal layer may be a single layer structure or a multilayer structure, such as Cu\Mo, Ti\Cu\Ti, and Mo\Al\Mo, and specifically can be a stacked structure of Ti/Al/Ti, and the thickness can be 500 angstroms/5000 angstroms/500 angstroms respectively. A layer of photoresist is coated on the first source/drain metal layer 31, and the photoresist is exposed by using a mask to form a photoresist unreserved area and a photoresist reserved area, in which the photoresist reserved area corresponds to an area where a pattern of the source/drain metal layer 31 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the first source/drain metal layer 31 of the photoresist unreserved area is completely etched away by an etching process, and the remaining photoresist is stripped to form a pattern of the first source/drain metal layer 31, the pattern of the first source/drain metal layer 31 includes a connecting line 311 and a first electrode 312 of the driving thin film transistor, in which the connecting line 311 is used to transmit a VDD signal, the first electrode can be a source electrode or a drain electrode, and the pattern of the first source/drain metal layer 31 also includes a data line.

Step 8. forming the second overcoat 32;

Specifically, a layer of organic resin having a thickness in a range from 18000 to 22000 angstroms can be coated, and cured at a high temperature to form the second overcoat 32.

Step 9. forming a pattern of the second source/drain metal layer 34;

A second source/drain metal layer 34 is formed on the second overcoat 32 by sputtering. The second source/drain metal layer 34 is of a metal layer/copper stacked structure. The adhesive force between the metal layer and the second overcoat 32 is greater than the adhesive force between the copper and the second overcoat 32, which increases the adhesive force between the copper and the second overcoat 32, so that the copper is not easy to fall off. Specifically, the metal layer may be made of Mo. In the second source/drain metal layer 34, the thickness of Mo may be 300 angstroms, and the thickness of copper may be about 2 μm.

A layer of photoresist is coated on the second source/drain metal layer 34, and the photoresist is exposed by using a mask to form a photoresist unreserved area and a photoresist reserved area, in which the photoresist reserved area corresponds to an area where the pattern of the second source/drain electrode 34 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the second source/drain metal layer 34 of the photoresist unreserved area is completely etched away by an etching process, and the remaining photoresist is stripped to form the pattern of the second source/drain metal layer 34. The pattern of the second source/drain metal layer 34 includes a signal wiring and a second pad 343, the signal wiring includes a VDD wiring 341 and a VSS wiring 342, in which the VSS wiring 342 is also used as a first pad, and the second pad 343 is connected to the first electrode 312 of the driving thin film transistor.

Step 10. forming the third overcoat 36;

Specifically, a layer of organic resin having a thickness in a range from 18000 to 22000 angstroms can be coated, and cured at a high temperature to form the third overcoat 36.

After that, the third overcoat 36 may be patterned to form a via hole exposing the VSS wiring 342 and the second pad 343.

After the first driving function layer is prepared through the above steps 1 to 10, the base substrate 10 can be turned over, and a second driving function layer can be prepared on the other side surface of the base substrate 10, to complete the preparation of the driving substrate.

In addition, when a copper layer is formed on the second overcoat 32 by sputtering, the plasma during the sputtering may damage the second overcoat 32, causing the debris of second overcoat 32 to fall off, thereby contaminating the sputtering chamber. In order to avoid this situation, after the second overcoat 32 is formed, a first passivation layer 33 is formed on the second overcoat 32, and the first passivation layer 33 can protect the second overcoat 32. The first passivation layer 33 can be made of inorganic insulating materials, such as silicon nitride, silicon oxide, or silicon oxynitride, and the thickness of the first passivation layer 33 may be in a range from 500 to 3000 angstroms.

If the copper layer is formed by low-temperature deposition, since the low-temperature deposition will not cause damage to the second overcoat 32, the step of forming the first passivation layer 33 can be omitted at this time.

In addition, when the third overcoat 36 is formed on the copper layer, the third overcoat 36 will oxidize the surface of the copper when it is cured at a high temperature. In order to avoid this situation, after the pattern of the second source/drain metal layer 34 is formed, a second passivation layer 35 is formed on the pattern of the second source/drain metal layer 34, in which the second passivation layer 35 can protect the copper and prevent the surface of the copper from being oxidized when the third overcoat 36 is cured at a high temperature. The second passivation layer 35 can be made of inorganic insulating materials, such as silicon nitride, silicon oxide, or silicon oxynitride, and the thickness of the second passivation layer 35 may be in a range from 500 to 3000 angstroms.

In another embodiment, copper is used to prepare a signal wiring, which is chemical plated to form a relatively thick copper layer, and an LED is used as an example of the electronic component, the method for preparing the driving substrate specifically includes the following steps.

Step 1. providing a base substrate 10, and forming a buffer layer and an active layer 11 on the base substrate 10;

Among them, the base substrate 10 may be a glass substrate, a quartz substrate or a flexible substrate.

A plasma-enhanced chemical vapor deposition (PECVD) method can be used to form a buffer layer on the base substrate 10. The buffer layer can be made of oxides, nitrides or oxynitrides, and the corresponding reaction gas is $SiH_4$, $NH_3$, $N_2$ or $SiH_2Cl_2$, $NH_3$, $N_2$. Specifically, the buffer layer may be of a laminated structure of silicon nitride/silicon oxide, and the thickness may be 500 angstroms/3000 angstroms respectively.

A semiconductor material is formed on the buffer layer, and the semiconductor material is patterned to form the active layer 11. The active layer 11 may be made of P—Si, and the thickness may be in a range from 400 to 500 angstroms, and specifically 470 angstroms.

Step 2. forming the first gate insulating layer 12;

Specifically, PECVD can be used to deposit the first gate insulating layer 12 having a thickness in a range from 400 to 800 angstroms. The first gate insulating layer 12 can be made of oxides, nitrides or oxynitrides, and the corresponding reaction gas is $SiH_4$, $NH_3$, $N_2$ or $SiH_2Cl_2$, $NH_3$, $N_2$.

Step 3. forming a pattern of the first gate metal layer 13;

Specifically, sputtering or thermal evaporation may be used to deposit the first gate metal layer 13 having a thickness in a range from 2500 to 3600 angstroms. The first gate metal layer 13 may be made of Cu, Al, Ag, Mo, Cr, Nd, Ni, Mn, Ti, Ta, W and other metals and alloys of these metals, and specifically Mo can be used. A layer of photoresist is coated on the first gate metal layer 13, and the photoresist is exposed by using a mask to form a photoresist unreserved area and a photoresist reserved area, in which the photoresist reserved area corresponds to the area where the pattern of the first gate metal layer 13 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the first gate metal layer 13 of the photoresist unreserved area is completely etched away by an etching process, and the remaining photoresist is stripped to form the pattern of the first gate metal layer 13. The pattern of the first gate metal layer 3 includes a gate line and a gate electrode of a thin film transistor.

Step 4: forming a second gate insulating layer 14;

Specifically, PECVD can be used to deposit the second gate insulating layer 14 having a thickness in a range from 1000 to 2000 angstroms. The second gate insulating layer 14 can be made of oxides, nitrides or oxynitrides, and the corresponding reaction gas is $SiH_4$, $NH_3$, $N_2$ or $SiH_2Cl_2$, $NH_3$, $N_2$.

Step 5. forming a pattern of the second gate metal layer 15;

Specifically, sputtering or thermal evaporation may be used to deposit the second gate metal layer 15 having a thickness in a range from 2500 to 3600 angstroms. The second gate metal layer 15 may be made of Cu, Al, Ag, Mo, Cr, Nd, Ni, Mn, Ti, Ta, W and other metals and alloys of these metals, and specifically Mo can be used. A layer of photoresist is coated on the second gate metal layer 15, and the photoresist is exposed by using a mask to form a photoresist unreserved area and a photoresist reserved area, in which the photoresist reserved area corresponds to an area where the pattern of the gate metal layer 15 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the second gate metal layer 15 of the photoresist unreserved area is completely etched away by an etching process, and the remaining photoresist is stripped to form the pattern of the second gate metal layer 15. The pattern of the second gate metal layer 15 includes a plate of the storage capacitor and the like.

Step 6. forming the first overcoat 30;

Specifically, a layer of organic resin having a thickness in a range from 18000 to 22000 angstroms can be coated, and cured at a high temperature to form the first overcoat 30.

Step 7. forming a pattern of the first source/drain metal layer 31;

Specifically, by magnetron sputtering, thermal evaporation or other film formation methods, a source/drain metal layer having a thickness of approximately 5000 to 6000 Å may be deposited. The source/drain metal layer may be a metal such as Cu, Al, Ag, Mo, Cr, Nd, Ni, Mn, Ti, Ta, and W, and an alloy of these metals. The source/drain metal layer may be a single layer structure or a multilayer structure, such as Cu\Mo, Ti\Cu\Ti, and Mo\Al\Mo, and specifically can be a stacked structure of Ti/Al/Ti, and the thickness can be 500 angstroms/5000 angstroms/500 angstroms respectively. A layer of photoresist is coated on the first source/drain metal layer 31, and the photoresist is exposed by using a mask to form a photoresist unreserved area and a photoresist reserved area, in which the photoresist reserved area corresponds to an area where pattern of the source/drain metal layer 31 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the first source/drain metal layer 31 of the photoresist unreserved area is completely etched away by an etching process, and the remaining photoresist is stripped to form the pattern of the first source/drain metal layer 31, the pattern of the first source/drain metal layer 31 includes a connecting line 311 and a first electrode 312 of the driving thin film transistor, in which the connecting line 311 is used to transmit a VDD signal, the first electrode can be a source electrode or a drain electrode, and the pattern of the first source/drain metal layer 31 also includes a data line.

Step 8. forming the second overcoat 32;

Specifically, a layer of organic resin having a thickness in a range from 18000 to 22000 angstroms can be coated, and cured at a high temperature to form the second overcoat 32.

Step 9. forming a pattern of the second source/drain metal layer 34;

A seed layer is formed on the second overcoat 32 by sputtering. The seed layer is of a metal layer/copper stacked structure. The adhesive force between the metal layer and the second overcoat 32 is greater than the adhesive force between the copper and the second overcoat 32, which increases the adhesive force between the copper and the second overcoat 32, so that the copper is not easy to fall off. Specifically, the metal layer may be made of Mo. The thickness of the seed layer is less than the threshold. Specifically, the thickness of Mo in the seed layer may be 300 angstroms, and the thickness of copper in the seed layer may be 3000 angstroms.

A layer of metal copper is grown on the seed layer by electroplating, the thickness of the grown copper can reach 2 μm or more, and the grown copper and the seed layer form the second source/drain metal layer 34.

A layer of photoresist is coated on the second source/drain metal layer 34, and the photoresist is exposed by using a mask to form a photoresist unreserved area and a photoresist reserved area, in which the photoresist reserved area corresponds to an area where the pattern of the second source/drain electrode 34 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the second source/drain metal layer 34 of the photoresist unreserved area is completely etched away by an etching process, and the remaining photoresist is stripped to form the pattern of the second source/drain metal layer 34. The pattern of the second source/drain metal layer 34 includes a signal wiring and a second pad 343, the signal wiring includes a VDD wiring 341 and a VSS wiring 342, in which the VSS wiring 342 is also used as first pad, and the second pad 343 is connected to the first electrode 312 of the driving thin film transistor.

Step 10. forming the third overcoat 36;

Specifically, a layer of organic resin having a thickness in a range from 18000 to 22000 angstroms can be coated, and cured at a high temperature to form the third overcoat 36.

After that, the third overcoat 36 may be patterned to form a via hole exposing the VSS wiring 342 and the second pad 343.

After the first driving function layer is prepared through the above steps 1 to 10, the base substrate 10 can be turned over, and a second driving function layer can be prepared on the other side surface of the base substrate 10, to complete the preparation of the driving substrate.

In addition, when a copper layer is formed on the second overcoat 32 by sputtering, the plasma during the sputtering may damage the second overcoat 32, causing the debris of second overcoat 32 to fall off, thereby contaminating the sputtering chamber. In order to avoid this situation, after the second overcoat 32 is formed, a first passivation layer 33 is formed on the second overcoat 32, and the first passivation layer 33 can protect the second overcoat 32. The first passivation layer 33 can be made of inorganic insulating materials, such as silicon nitride, silicon oxide, or silicon oxynitride, and the thickness of the first passivation layer 33 may be in a range from 500 to 3000 angstroms.

If the copper layer is formed by low-temperature deposition, since the low-temperature deposition will not cause damage to the second overcoat 32, the step of forming the first passivation layer 33 can be omitted at this time.

In addition, when the third overcoat 36 is formed on the copper layer, the third overcoat 36 will oxidize the surface of the copper when it is cured at a high temperature. In order to avoid this situation, after the pattern of the second source/drain metal layer 34 is formed, a second passivation layer 35 is formed on the pattern of the second source/drain metal layer 34, in which the second passivation layer 35 can protect the copper and prevent the surface of the copper from being oxidized when the third overcoat 36 is cured at a high temperature. The second passivation layer 35 can be made of inorganic insulating materials, such as silicon nitride, silicon oxide, or silicon oxynitride, and the thickness of the second passivation layer 35 may be in a range from 500 to 3000 angstroms.

In another embodiment, copper is used to prepare a signal wiring, which is chemical plated to form a relatively thick copper layer, and an LED is used as an example of the electronic component, the method for preparing the driving substrate specifically includes the following steps.

Step 1. providing a base substrate 10, and forming a buffer layer and an active layer 11 on the base substrate 10;

Among them, the base substrate 10 may be a glass substrate, a quartz substrate or a flexible substrate.

A plasma-enhanced chemical vapor deposition (PECVD) method can be used to form a buffer layer on the base substrate 10. The buffer layer can be made of oxides, nitrides or oxynitrides, and the corresponding reaction gas is $SiH_4$, $NH_3$, $N_2$ or $SiH_2Cl_2$, $NH_3$, $N_2$. Specifically, the buffer layer may be of a laminated structure of silicon nitride/silicon oxide, and the thickness may be 500 angstroms/3000 angstroms respectively.

A semiconductor material is formed on the buffer layer, and the semiconductor material is patterned to form the active layer 11. The active layer 11 may be made of P—Si, and the thickness may be in a range from 400 to 500 angstroms, and specifically 470 angstroms.

Step 2. forming the first gate insulating layer 12;

Specifically, PECVD can be used to deposit the first gate insulating layer 12 having a thickness in a range from 400 to 800 angstroms. The first gate insulating layer 12 can be made of oxides, nitrides or oxynitrides, and the corresponding reaction gas is $SiH_4$, $NH_3$, $N_2$ or $SiH_2Cl_2$, $NH_3$, $N_2$.

Step 3. forming a pattern of the first gate metal layer 13;

Specifically, sputtering or thermal evaporation may be used to deposit the first gate metal layer 13 having a thickness in a range from 2500 to 3600 angstroms. The first gate metal layer 13 may be made of Cu, Al, Ag, Mo, Cr, Nd, Ni, Mn, Ti, Ta, W and other metals and alloys of these metals, and specifically Mo can be used. A layer of photoresist is coated on the first gate metal layer 13, and the photoresist is exposed by using a mask to form a photoresist unreserved area and a photoresist reserved area, in which the photoresist reserved area corresponds to the area where the pattern of the first gate metal layer 13 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the first gate metal layer 13 of the photoresist unreserved area is completely etched away by an etching process, and the remaining photoresist is stripped to form the pattern of the first gate metal layer 13. The pattern of the first gate metal layer 13 includes a gate line and a gate of a thin film transistor.

Step 4: forming a second gate insulating layer 14;

Specifically, PECVD can be used to deposit the second gate insulating layer 14 having a thickness in a range from 1000 to 2000 angstroms. The second gate insulating layer 14 can be made of oxides, nitrides or oxynitrides, and the corresponding reaction gas is $SiH_4$, $NH_3$, $N_2$ or $SiH_2Cl_2$, $NH_3$, $N_2$.

Step 5. forming a pattern of the second gate metal layer 15;

Specifically, sputtering or thermal evaporation may be used to deposit the second gate metal layer 15 having a thickness in a range from 2500 to 3600 angstroms. The second gate metal layer 15 may be made of Cu, Al, Ag, Mo, Cr, Nd, Ni, Mn, Ti, Ta, W and other metals and alloys of these metals, and specifically Mo can be used. A layer of photoresist is coated on the second gate metal layer 15, and the photoresist is exposed by using a mask to form a photoresist unreserved area and a photoresist reserved area, in which the photoresist reserved area corresponds to an area where the pattern of the gate metal layer 15 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the second gate metal layer 15 of the photoresist unreserved area is completely etched away by an etching process, and the remaining photoresist is stripped to form the pattern of the second gate metal layer 15. The pattern of the second gate metal layer 15 includes a plate of the storage capacitor and the like.

Step 6. forming the first overcoat 30;

Specifically, a layer of organic resin having a thickness in a range from 18000 to 22000 angstroms can be coated, and cured at a high temperature to form the first overcoat 30.

Step 7. forming a pattern of the first source/drain metal layer 31;

Specifically, by magnetron sputtering, thermal evaporation or other film formation methods, a source/drain metal layer having a thickness of approximately 5000 to 6000 Å may be deposited. The source/drain metal layer may be a metal such as Cu, Al, Ag, Mo, Cr, Nd, Ni, Mn, Ti, Ta, and W, and an alloy of these metals. The source/drain metal layer may be a single layer structure or a multilayer structure, such as Cu\Mo, Ti\Cu\Ti, and Mo\Al\Mo, and specifically can be a stacked structure of Ti/Al/Ti, and the thickness can be 500 angstroms/5000 angstroms/500 angstroms respectively. A layer of photoresist is coated on the first source/drain metal layer 31, and the photoresist is exposed by using a mask to form a photoresist unreserved area and a photoresist reserved area, in which the photoresist reserved area corresponds to an area where pattern of the source/drain metal layer 31 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the first source/drain metal layer 31 of the photoresist unreserved area is completely etched away by an etching process, and the remaining photoresist is stripped to form a pattern of the first source/drain metal layer 31, the pattern of the first source/drain metal layer 31 includes a connecting line 311 and a first electrode 312 of the driving thin film transistor, in which the connecting line 311 is used to transmit a VDD signal, the first electrode can be a source electrode or a drain electrode, and the pattern of the first source/drain metal layer 31 also includes a data line.

Step 8. forming the second overcoat 32;

Specifically, a layer of organic resin having a thickness in a range from 18000 to 22000 angstroms can be coated, and cured at a high temperature to form the second overcoat 32.

Step 9. forming a pattern of the second source/drain metal layer 34;

A seed layer is formed on the second overcoat 32 by sputtering. The seed layer is of a metal layer/copper stacked structure. The adhesive force between the metal layer and the second overcoat 32 is greater than the adhesive force between the copper and the second overcoat 32, which increases the adhesive force between the copper and the second overcoat 32, so that the copper is not easy to fall off. Specifically, the metal layer may be made of Mo. The thickness of the seed layer is less than the threshold. Specifically, the thickness of Mo in the seed layer may be 300 angstroms, and the thickness of copper in the seed layer may be 3000 angstroms.

A layer of photoresist is coated on the seed layer, and the photoresist is exposed by using a mask to form a photoresist unreserved area and a photoresist reserved area, in which the photoresist reserved area corresponds to an area in which the pattern of the second source/drain metal layer 34 is located, and the photoresist unreserved area corresponds to an area outside the above pattern; development processing is performed, so that the photoresist in the photoresist unreserved area is completely removed, and the thickness of the photoresist in the photoresist reserved area remains unchanged; and the seed layer of the photoresist unreserved area is completely etched away by an etching process, to form a pattern of the seed layer.

A layer of metal copper is grown on the seed layer by chemical plating, the thickness of the grown copper can reach 2 to 3 μm, and the pattern of the grown copper and the seed layer form the pattern of the second source/drain metal layer 34. The pattern of the second source/drain metal layer 34 includes a signal wiring and a second pad 343. The signal wiring includes a VDD wiring 341 and a VSS wiring 342, in which the VSS wiring 342 is also used as the first pad, and the second pad 343 is connected to the first electrode 312 of the driving thin film transistor.

Step 10. forming the third overcoat 36;

Specifically, a layer of organic resin having a thickness in a range from 18000 to 22000 angstroms can be coated, and cured at a high temperature to form the third overcoat 36.

After that, the third overcoat 36 may be patterned to form a via hole exposing the VSS wiring 342 and the second pad 343.

After the first driving function layer is prepared through the above steps 1 to 10, the base substrate 10 can be turned over, and a second driving function layer can be prepared on the other side surface of the base substrate 10, to complete the preparation of the driving substrate.

In addition, when a copper layer is formed on the second overcoat 32 by sputtering, the plasma during the sputtering may damage the second overcoat 32, causing the debris of second overcoat 32 to fall off, thereby contaminating the sputtering chamber. In order to avoid this situation, after the second overcoat 32 is formed, a first passivation layer 33 is formed on the second overcoat 32, and the first passivation layer 33 can protect the second overcoat 32. The first passivation layer 33 can be made of inorganic insulating materials, such as silicon nitride, silicon oxide, or silicon oxynitride, and the thickness of the first passivation layer 33 may be in a range from 500 to 3000 angstroms.

If the copper layer is formed by low-temperature deposition, since the low-temperature deposition will not cause damage to the second overcoat 32, the step of forming the first passivation layer 33 can be omitted at this time.

In addition, when the third overcoat 36 is formed on the copper layer, the third overcoat 36 will oxidize the surface of the copper when it is cured at a high temperature. In order to avoid this situation, after the pattern of the second source/drain metal layer 34 is formed, a second passivation layer 35 is formed on the pattern of the second source/drain metal layer 34, in which the second passivation layer 35 can protect the copper and prevent the surface of the copper from being oxidized when the third overcoat 36 is cured at a high temperature. The second passivation layer 35 can be made of inorganic insulating materials, such as silicon nitride, silicon oxide, or silicon oxynitride, and the thickness of the second passivation layer 35 may be in a range from 500 to 3000 angstroms.

In the method embodiments of the present disclosure, the serial numbers of the steps cannot be used to define the sequence of the steps. As for one skilled in the art, the changes in the order of steps without paying creative work also fall within the scope of the present disclosure.

Unless otherwise defined, technical terms or scientific terms used herein have the normal meaning commonly understood by one skilled in the field of the present disclosure. The words "first", "second", and the like used herein does not denote any order, quantity, or importance, but rather merely serves to distinguish different components. The "including", "comprising", and the like used in the present disclosure means that the element or item appeared in front of the word encompasses the element or item and their equivalents listed after the word, and does exclude other elements or items. The word "connected" or "connecting" and the like are not limited to physical or mechanical connections, but may include electrical connections, whether direct or indirect. "On", "under", "left", "right" and the like are only used to represent relative positional relationships, and when the absolute position of the described object is changed, the relative positional relationship may also be changed, accordingly.

It will be understood that when an element, such as a layer, film, area, or substrate, is referred to as being "on" or "under" another element, the element may be directly "on" or "under" another element, or there may be an intermediate element.

The above description are preferred embodiments of the present disclosure. It should be noted that one skilled in the art would make several improvements and substitutions without departing from the principles of the present disclosure. These improvements and modifications should also be regarded as the protection scope of the present disclosure.

What is claimed is:

1. A driving substrate, comprising:
   a base substrate;
   a first driving function layer arranged on a first surface of the base substrate, the first driving function layer comprising a plurality of driving thin film transistors and a plurality of signal wirings, and at least one of the plurality of signal wirings being of a single-layer structure and having a thickness greater than a threshold;
   a pad layer arranged on a surface of the first driving function layer away from the base substrate, the pad layer comprising a plurality of first pads and a plurality of second pads, and each of the plurality of first pads being connected to a first electrode of the corresponding driving thin film transistor and each of the plurality of second pads being connected to a common electrode line in the plurality of signal wirings.

2. The driving substrate of claim 1, further comprising:
   a second driving function layer arranged on a second surface of the base substrate, the second surface being opposite to the first surface, and the second driving function layer comprising a lead liner and a bonding pin connected to the lead liner;
   a plurality of grooves arranged in a side surface of the base substrate, each of the plurality of grooves extending in a direction perpendicular to the base substrate and penetrating through the first surface and the second surface of the base substrate; and
   a plurality of conductive connection portions corresponding to the plurality of grooves respectively, at least a part of the conductive connection portions being located in the corresponding grooves, and each conductive connection portion being configured to connect a corresponding signal wiring and a corresponding lead liner respectively.

3. The driving substrate of claim 1, wherein the plurality of signal wirings comprises a power supply voltage signal line and the common electrode line, and the power supply voltage signal line and the common electrode line each have a thickness greater than the threshold.

4. The driving substrate of claim 3, wherein the power supply voltage signal line and the common electrode line are arranged in a same layer and made of a same material.

5. The driving substrate of claim 3, further comprising:
   a signal transmission line connected to the plurality of signal wirings, wherein the signal transmission line and the plurality of signal wirings form a grid structure.

6. The driving substrate of claim 1, wherein in a direction away from the first surface, the first driving function layer sequentially comprises:
   an active layer;
   a first gate insulating layer;
   a first gate metal layer;
   a second gate insulating layer;
   a second gate metal layer;
   a first overcoat;
   a first source/drain metal layer;
   a second overcoat;
   a second source/drain metal layer, a pattern of the second source/drain metal layer comprising the plurality of signal wirings; and
   a third overcoat.

7. The driving substrate of claim 6, wherein the second source/drain metal layer comprises a copper layer and a metal layer that are stacked, the metal layer is located on a surface of the copper layer proximate to the base substrate, and an adhesive force between the metal layer and the second overcoat is greater than an adhesive force between the copper layer and the second overcoat.

8. The driving substrate of claim 7, wherein the copper layer has a thickness in a range from 2 μm to 30 μm.

9. The driving substrate of claim 7, further comprising a first passivation layer located between the copper layer and the first overcoat, wherein the first passivation layer is made of an inorganic insulating material.

10. The driving substrate of claim 7, further comprising a second passivation layer located between the copper layer and the second overcoat, wherein the second passivation layer is made of an inorganic insulating material.

11. A display device, comprising the driving substrate of claim 1 and an electronic component fixed on the pad layer, a first pole of the electronic component being bonded to the first pad, and a second pole of the electronic component being bonded to the second pad.

12. A method for preparing a driving substrate, comprising:
   providing a base substrate;
   forming a first driving function layer on a first surface of the base substrate, the first driving function layer comprising a plurality of driving thin film transistors and a plurality of signal wirings, and at least one of the plurality of signal wirings being of a single-layer structure and having a thickness greater than a threshold;
   forming a pad layer on a surface of the first driving function layer away from the base substrate, the pad layer comprising a plurality of first pads and a plurality of second pads, and each of the plurality of first pad being connected to a first electrode of the corresponding driving thin film transistor and each of the plurality of second pad being connected to a common electrode line in the plurality of signal wirings.

13. The method of claim 12, wherein the driving substrate comprises a pattern of a first source/drain metal layer and a pattern of a second source/drain metal layer, the pattern of the second source/drain metal layer comprises the plurality of signal wirings, and the forming the signal wiring comprises:
   forming a seed layer having a thickness less than a threshold;
   growing a conductive layer on the seed layer by an electroplating method, the seed layer and the conductive layer forming the second source/drain metal layer;
   patterning the second source/drain metal layer to form the plurality of signal wirings.

14. The method of claim 12, wherein the driving substrate comprises a pattern of a first source/drain metal layer and a pattern of a second source/drain metal layer, the pattern of the second source/drain metal layer comprises the plurality of signal wirings, and the forming the plurality of signal wirings comprises: forming a seed layer having a thickness less than a threshold;

patterning the seed layer to form a pattern of the seed layer, the pattern of the seed layer being located in the area where the plurality of signal wirings to be formed is located;

growing a pattern of a conductive layer on the pattern of the seed layer by chemical plating, the pattern of the conductive layer and the pattern of the seed layer forming the plurality of signal wirings.

15. The method of claim 13, wherein the forming the seed layer comprises:

forming a copper layer and a metal layer that are stacked, the metal layer being located on a surface of the copper layer proximate to the base substrate, and an adhesive force between the metal layer and the insulating layer being greater than an adhesive force between the copper layer and the insulating layer.

16. The method of claim 14, wherein the forming the seed layer comprises:

forming a copper layer and a metal layer that are stacked, the metal layer being located on a surface of the copper layer proximate to the base substrate, and an adhesive force between the metal layer and the insulating layer being greater than an adhesive force between the copper layer and the insulating layer.

\* \* \* \* \*